(12) United States Patent
Xia

(10) Patent No.: US 10,153,354 B2
(45) Date of Patent: Dec. 11, 2018

(54) TFT SUBSTRATE MANUFACTURING METHOD

(71) Applicant: Shenzhen China Star Optoelectronics Semiconductor Display Technology Co., Ltd., Shenzhen (CN)

(72) Inventor: Hui Xia, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

(*) Notice: Subject to any disclaimer, the term of this patent is extended or adjusted under 35 U.S.C. 154(b) by 0 days.

(21) Appl. No.: 15/570,369

(22) PCT Filed: Jun. 20, 2017

(86) PCT No.: PCT/CN2017/089247
§ 371 (c)(1),
(2) Date: Oct. 30, 2017

(65) Prior Publication Data
US 2018/0331200 A1 Nov. 15, 2018

(30) Foreign Application Priority Data

May 15, 2017 (CN) .......................... 2017 1 0340896

(51) Int. Cl.
*H01L 21/00* (2006.01)
*H01L 29/66* (2006.01)
(Continued)

(52) U.S. Cl.
CPC ...... *H01L 29/66045* (2013.01); *H01L 21/043* (2013.01); *H01L 21/044* (2013.01);
(Continued)

(58) Field of Classification Search
CPC ......... H01L 29/66045; H01L 29/78684; H01L 21/043; H01L 29/1606; H01L 29/76803; H01L 21/044; H01L 29/4908; H01L 29/45
See application file for complete search history.

(56) References Cited

U.S. PATENT DOCUMENTS

2015/0029607 A1* 1/2015 Lee .......................... C23C 16/01
359/891

FOREIGN PATENT DOCUMENTS

| CN | 102629578 A | 8/2012 |
| CN | 103318881 A | 9/2013 |
| CN | 103769025 A | 5/2014 |

* cited by examiner

*Primary Examiner* — Richard A Booth
(74) *Attorney, Agent, or Firm* — Leong C. Lei

(57) ABSTRACT

The present invention provides a TFT substrate manufacturing method, which includes first forming a graphene semiconductor active layer on a metal foil, then sequentially forming an inorganic insulation layer and an organic base on the graphene semiconductor active layer, followed by turning up-side down to set the metal foil on a topmost layer, then forming a photoresist layer, through a patterning operation, on the metal foil and subjecting the metal foil to etching to form a source electrode and a drain electrode, then sequentially forming an organic insulation layer and a gate electrode conductor layer on the photoresist layer and the graphene semiconductor active layer, and finally, applying a photoresist peeling agent to remove the photoresist layer with portions of the organic insulation layer and the gate electrode conductor layer located thereon removed therewith so as to obtain patterned gate insulation layer and gate electrode. The manufacturing method involves an operation of turning up-side down to to allow the metal foil that is used to deposit a graphene film to be re-used as an electrode (Continued)

material for formation of the source and drain electrodes so that an effect of lowering down manufacturing cost and simplifying operations can be achieved. And, through application of lift-off technique, only one mask is necessary to obtain patterned source electrode, drain electrode, and gate electrode.

18 Claims, 5 Drawing Sheets

(51) Int. Cl.
*H01L 29/786* (2006.01)
*H01L 21/04* (2006.01)
*H01L 29/16* (2006.01)
*H01L 29/49* (2006.01)
*H01L 29/45* (2006.01)

(52) U.S. Cl.
CPC .... *H01L 29/1606* (2013.01); *H01L 29/78603* (2013.01); *H01L 29/78684* (2013.01); *H01L 29/45* (2013.01); *H01L 29/4908* (2013.01)

TFT SUBSTRATE MANUFACTURING METHOD

BACKGROUND OF THE INVENTION

1. Field of the Invention

The present invention relates to the field of display technology, and more particular to a thin-film transistor (TFT) substrate manufacturing method.

2. The Related Arts

In the active matrix display technology, pixels are each driven by a thin-film transistor (TFT) integrated therewith on the back side in order to achieve a desired screen displaying effect of high speed, high brightness, and high contrast. TFTs that are commonly available are made up of three electrodes of gate, source, and drain, an insulation layer, and a semiconductor layer.

Graphene is the thinnest and toughest nanometer material that is currently known in the world and is one of the hot spots of study and research due to excellent conductivity adjustability, mechanical properties, and thermal conductivity. Being a novel material that is extremely thin and has extremely high electrical conductivity, graphene has greater potential for application in electronic elements and transistors. Graphene is reportedly having extremely low sheet resistance (less than 100 Ω/□), but can become a wide-band two-dimensional insulation material after being subjected to doping. Thus, having been treated properly, graphene may show property of n type or p type semiconductor and can be used in TFT devices of the display business. Contemporarily, for fabrication of large-area graphene, a technique that is commonly used and may provide better performance of graphene is chemical vapor deposition (CVD). A process involving such a technique to fabricate a TFT device is first depositing, through CVD, graphene on a metal base, such as copper and nickel, followed by etching off the metal base to obtain a graphene film, and then transferring the graphene film, through a roll-to-roll process or other processes, to a base on which a desired film has been deposited for being assembled into a TFT device. Such a process suffers various disadvantages, such as long cycle time, complicated operations, and increased expenditure for the metal base.

Thus, it is very important to develop a manufacturing method for graphene-contained TFT substrates with simple operations and low cost.

SUMMARY OF THE INVENTION

An objective of the present invention is to provide a thin film transistor (TFT) substrate manufacturing method, which lowers down manufacturing costs, simplifies operations, and reducing the number of mask involved.

To achieve the above objective, the present invention provides a TFT substrate manufacturing method, which comprises the following steps:

Step S1: providing a metal foil, depositing a graphene film on the metal foil, and applying an operation of changing graphene band gap to obtain a graphene semiconductor active layer;

Step S2: forming, through deposition, an inorganic insulation layer on the graphene semiconductor active layer;

Step S3: forming an organic base on the inorganic insulation layer to form a primary structure;

Step S4: turning up-side down the primary structure formed in Step S3 to set the organic base as a bottommost layer and the metal foil as a topmost layer, and forming a photoresist layer, through a patterning operation with a mask, on the metal foil;

Step S5: subjecting the metal foil to etching by using the photoresist layer as a shielding layer so as to form a source electrode and a drain electrode that are spaced from each other;

Step S6: forming an organic insulation layer on the photoresist layer and the graphene semiconductor active layer, and forming, through deposition, a gate electrode conductor layer on the organic insulation layer; and Step S7: applying a photoresist peeling agent to remove the photoresist layer and also to have portions of the organic insulation layer and the gate electrode conductor layer that are located on the photoresist layer removed simultaneously with the photoresist layer such that a gate insulation layer is obtained with a remaining portion of the organic insulation layer so as to be located on the graphene semiconductor active layer and between the source electrode and the drain electrode and a gate electrode is obtained with a remaining portion of the gate electrode conductor layer so as to be located on the gate insulation layer.

The metal foil is made of a material of copper or nickel.

In Step S1, the operation of changing graphene band gap involves chemical doping, wherein chemical doping is conducted on the graphene film at the same time of deposition thereof so that graphene so deposited is a doped graphene film so as to obtain the graphene semiconductor active layer; or, alternatively, the operation of changing graphene band gap involves photolithography, wherein, after the deposition of the graphene film, the graphene film is cut into thin ribbons to form graphene nanoribbon, so as to obtain the graphene semiconductor active layer.

In Step S1, plasma enhanced chemical vapor deposition is used to deposit the graphene film, and the graphene film so deposited is a single-layered graphene film; and the graphene semiconductor active layer has a bang gap that is greater than 0.1 eV.

In Step S2, chemical vapor deposition is used to deposit and form the inorganic insulation layer, and the inorganic insulation layer is made of a material comprising silicon nitride, silicon oxide, diyttrium trioxide, or hafnium dioxide.

In Step S3, the organic base is formed through solution coating and curing and the organic base is made of a material of polydimethylsiloxane.

In Step S5, a wet etching operation is applied to subject the metal foil to etching.

In Step S6, a coating operation is applied to form the organic insulation layer, and the organic insulation layer is made of a material of polymethylmethacrylate.

In Step S6, physical vapor deposition is applied deposit and form the gate electrode conductor layer, and the gate electrode conductor layer is made of a material comprising aluminum, copper, or indium tin oxide.

The TFT substrate manufacturing method further comprises Step S8 of providing a reinforcement base and melting the organic base for attaching to the reinforcement base;

wherein the reinforcement base comprises glass, a plastic material of polyethylene terephthalate, or a silicon plate.

The present invention also provides a TFT substrate manufacturing method, which comprises the following steps:

Step S1: providing a metal foil, depositing a graphene film on the metal foil, and applying an operation of changing graphene band gap to obtain a graphene semiconductor active layer;

Step S2: forming, through deposition, an inorganic insulation layer on the graphene semiconductor active layer;

Step S3: forming an organic base on the inorganic insulation layer to form a primary structure;

Step S4: turning up-side down the primary structure formed in Step S3 to set the organic base as a bottommost layer and the metal foil as a topmost layer, and forming a photoresist layer, through a patterning operation with a mask, on the metal foil;

Step S5: subjecting the metal foil to etching by using the photoresist layer as a shielding layer so as to form a source electrode and a drain electrode that are spaced from each other;

Step S6: forming an organic insulation layer on the photoresist layer and the graphene semiconductor active layer, and forming, through deposition, a gate electrode conductor layer on the organic insulation layer; and Step S7: applying a photoresist peeling agent to remove the photoresist layer and also to have portions of the organic insulation layer and the gate electrode conductor layer that are located on the photoresist layer removed simultaneously with the photoresist layer such that a gate insulation layer is obtained with a remaining portion of the organic insulation layer so as to be located on the graphene semiconductor active layer and between the source electrode and the drain electrode and a gate electrode is obtained with a remaining portion of the gate electrode conductor layer so as to be located on the gate insulation layer;

wherein in Step S2, chemical vapor deposition is used to deposit and form the inorganic insulation layer, and the inorganic insulation layer is made of a material comprising silicon nitride, silicon oxide, diyttrium trioxide, or hafnium dioxide; and wherein in Step S3, the organic base is formed through solution coating and curing and the organic base is made of a material of polydimethylsiloxane.

The efficacy of the present invention is that the present invention provides a TFT substrate manufacturing method, which comprises first depositing a graphene film on a metal foil, followed by applying an operation of changing graphene bang gap to form a graphene semiconductor active layer, and then, sequentially forming an inorganic insulation layer and an organic base on the graphene semiconductor active layer, wherein through an operation turning up-side down, the metal foil is set on a topmost layer, followed by forming a photoresist layer, through a patterning operation, on the metal foil, subjecting the metal foil to etching with the photoresist layer serving as a shielding layer to form a source electrode and a drain electrode, and then, sequentially forming an organic insulation layer and a gate electrode conductor layer on the photoresist layer and the graphene semiconductor active layer, and finally, applying a photoresist peeling agent to remove the photoresist layer with portions of the organic insulation layer and the gate electrode conductor layer located on the photoresist layer being simultaneously therewith to thereby form patterned gate insulation layer and gate electrode. The manufacturing method involves an operation of turning up-side down to to allow the metal foil that is used to deposit a graphene film to be re-used as an electrode material for formation of the source and drain electrodes so that an effect of lowering down manufacturing cost and simplifying operations can be achieved. And, through application of lift-off technique, only one mask is necessary to obtain patterned source electrode, drain electrode, and gate electrode.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
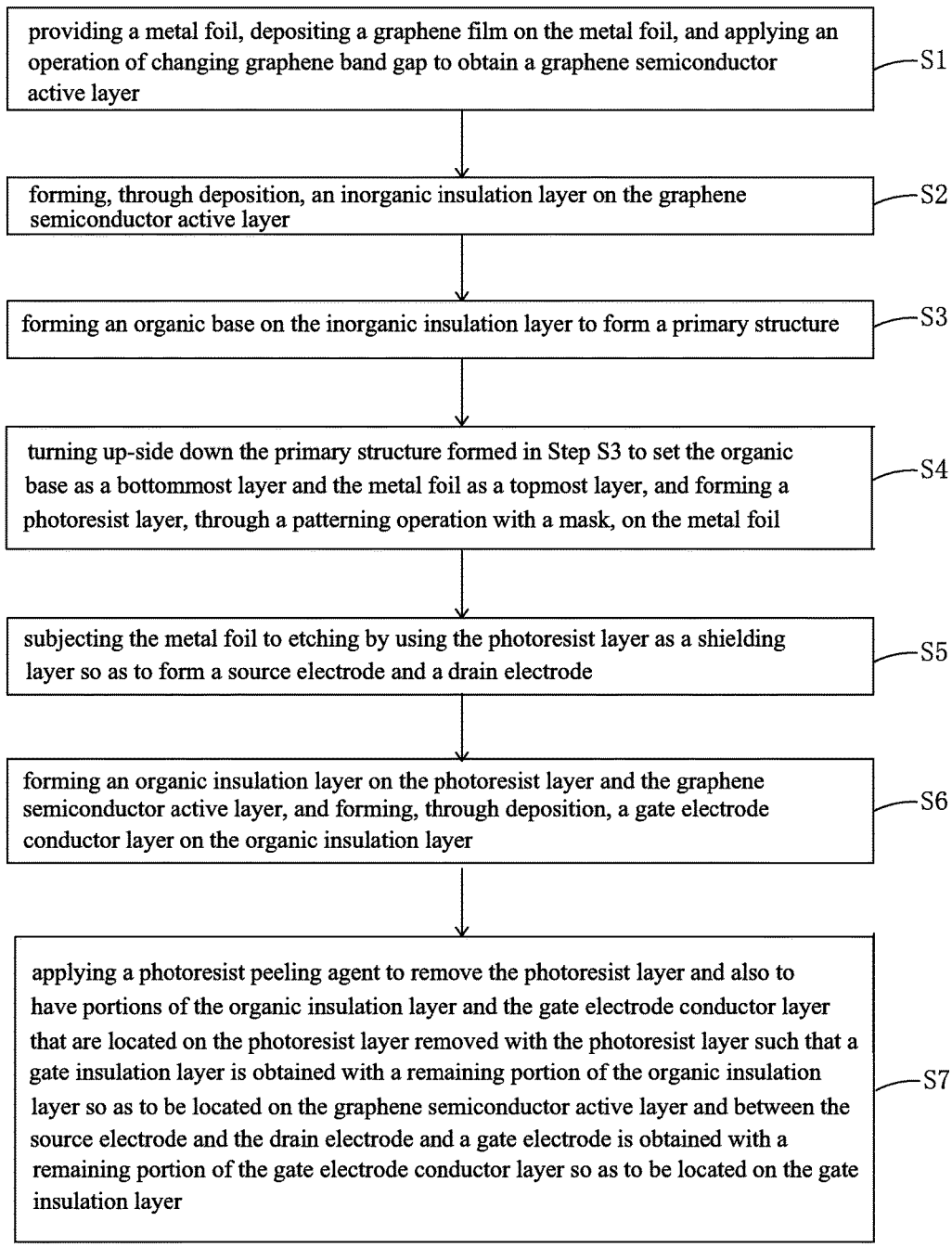
FIG. 1 is a flow chart illustrating a thin-film transistor (TFT) substrate manufacturing method according to the present invention
Figure 2:
FIG. 2 is a schematic view illustrating Step S1 of the TFT substrate manufacturing method according to the present invention.

Referring to FIG. 1, the present invention provides a TFT substrate manufacturing method, which comprises the following steps:

Step S1: as shown in FIG. 2, providing a metal foil 100', depositing a graphene film on the metal foil 100', and applying an operation of changing graphene band gap to obtain a graphene semiconductor active layer 200.

Specifically, in the present invention, the metal foil 100' is made of a material that serves as a material of a base for forming, through deposition, the graphene film and also possesses electrical conductivity to serve, subsequently, a material of an electrode, such as a metal material, including copper (Cu) or nickel (Ni).

Specifically, in Step S1, the operation of changing graphene band gap involves chemical doping, which is, specifically, conducting chemical doping to the graphene film at the same time of deposition thereof so that the graphene film so deposited is a doped graphene film so as to obtain the graphene semiconductor active layer 200; or, alternatively, the operation of changing graphene band gap involves photolithography, which is, specifically, cutting, after the deposition of the graphene film, the graphene film into thin ribbons to form graphene nanoribbon (GNR), so as to obtain the graphene semiconductor active layer 200.

Specifically, in Step S1, the graphene semiconductor active layer 200 so obtained has a bang gap that is greater than 0.1 eV.

Specifically, in Step S1, plasma enhanced chemical vapor deposition (PECVD) is used to deposit the graphene film, and the graphene film so deposited is preferably a single-layered graphene film having a thickness that is preferably less than 5 nm.

Figure 3:
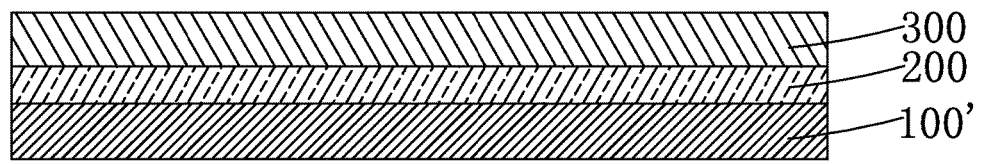
FIG. 3 is a schematic view illustrating Step S2 of the TFT substrate manufacturing method according to the present invention.

Step S2: as shown in FIG. 3, forming, through deposition, an inorganic insulation layer 300 on the graphene semiconductor active layer 200 in order to provide protection to the graphene semiconductor active layer 200 for preventing influence caused by an organic base, which is formed subsequently, on the graphene semiconductor active layer 200.

Specifically, in Step S2, chemical vapor deposition (CVD) is used to deposit and form the inorganic insulation layer 300, and the inorganic insulation layer 300 is made of material that comprises an inorganic material, including for example silicon nitride (SiNx), silicon oxide ($SiO_2$), diyttrium trioxide, and hafnium dioxide ($HfO_2$).

Figure 4:
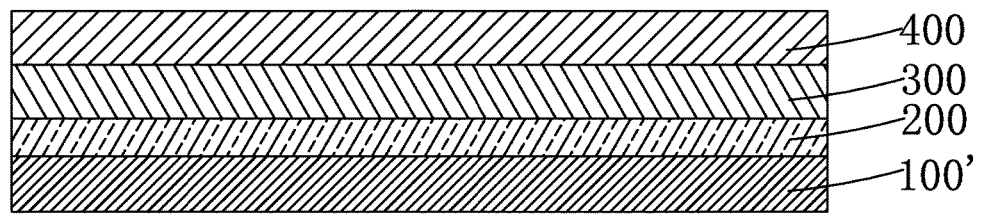
FIG. 4 is a schematic view illustrating Step S3 of the TFT substrate manufacturing method according to the present invention.

Step S3: as shown in FIG. 4, forming an organic base 400 on the inorganic insulation layer 300 to form a primary structure.

Specifically, in Step S3, the organic base 400 is formed through solution coating and curing and the organic base 400 is made of a material that can be polydimethylsiloxane (PDMS).

Figure 5:
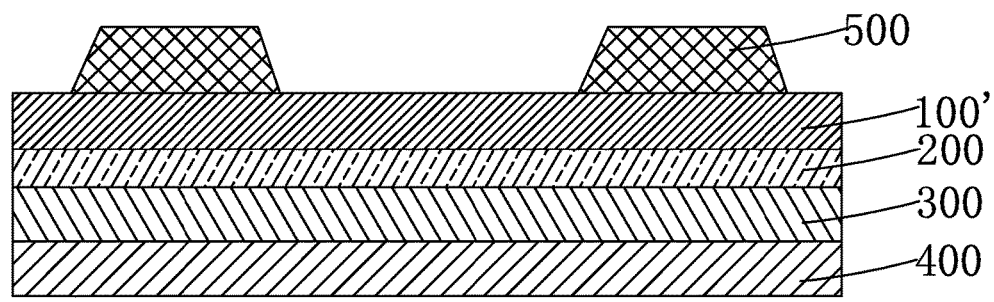
FIG. 5 is a schematic view illustrating Step S4 of the TFT substrate manufacturing method according to the present invention.

Step S4: as shown in FIG. 5, turning up-side down the primary structure formed in Step S3 to set the organic base 400 as a bottommost layer and the metal foil 100' as a topmost layer, and forming a photoresist (PR) layer 500, through a patterning operation with a mask, on the metal foil 100'.

Specifically, in Step S4, the patterning operation specifically comprises a coating step, an exposure step, and a development step that are carried out in sequence.

Figure 6:
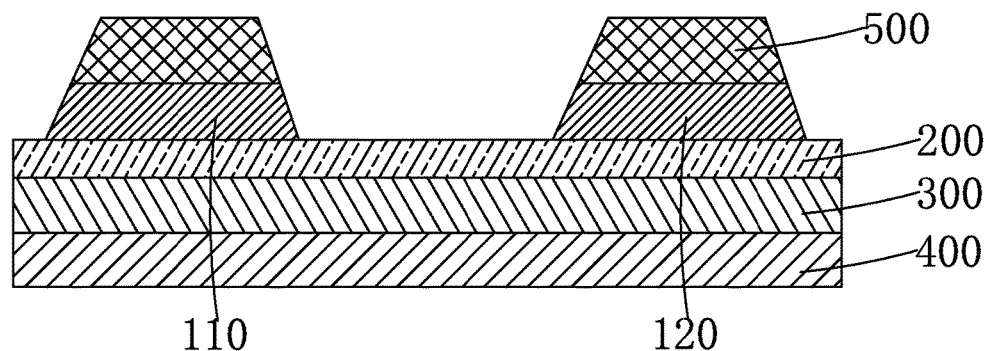
FIG. 6 is a schematic view illustrating Step S5 of the TFT substrate manufacturing method according to the present invention.

Step S5: as shown in FIG. 6, subjecting the metal foil 100' to etching by using the photoresist layer 500 as a shielding layer so as to form a source electrode 110 and a drain electrode 120 that are spaced from each other.

Specifically, in Step S5, a wet etching operation is applied to subject the metal foil 100' to etching.

Figure 7:
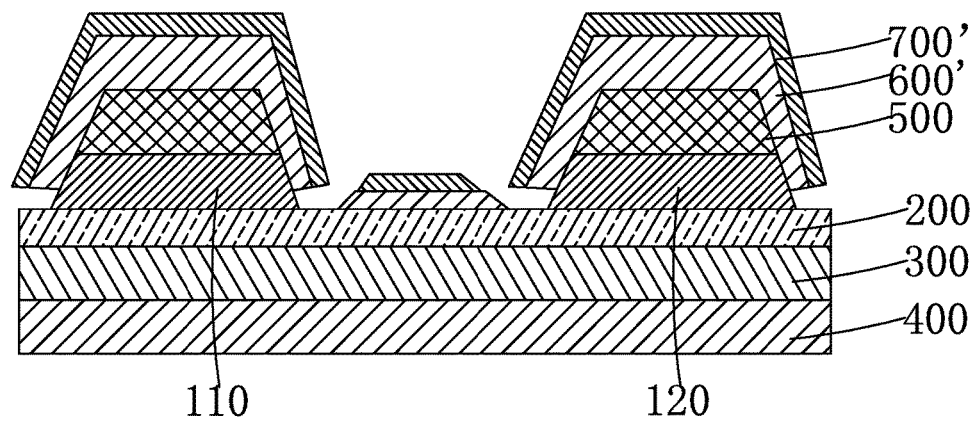
FIG. 7 is a schematic view illustrating Step S6 of the TFT substrate manufacturing method according to the present invention.

Step S6: as shown in FIG. 7, forming an organic insulation layer 600' on the photoresist layer 500 and the graphene semiconductor active layer 200, and forming, through deposition, a gate electrode conductor layer 700' on the organic insulation layer 600'.

Specifically, in Step S6, a coating operation is applied to form the organic insulation layer 600', and the organic insulation layer 600' can be formed on the photoresist layer 500 at a low temperature. The organic insulation layer 600' has a dielectric constant that is three times of the dielectric constant of vacuum, such as having a material of polymethylmethacrylate (PMMA).

Specifically, in Step S6, physical vapor deposition (PVD) is used to deposit and form the gate electrode conductor layer 700', and the gate electrode conductor layer 700' is made of a material that is a metal or oxide having electrical conductivity, such as aluminum (Al), copper, and indium tin oxide (ITO).

Figure 8:
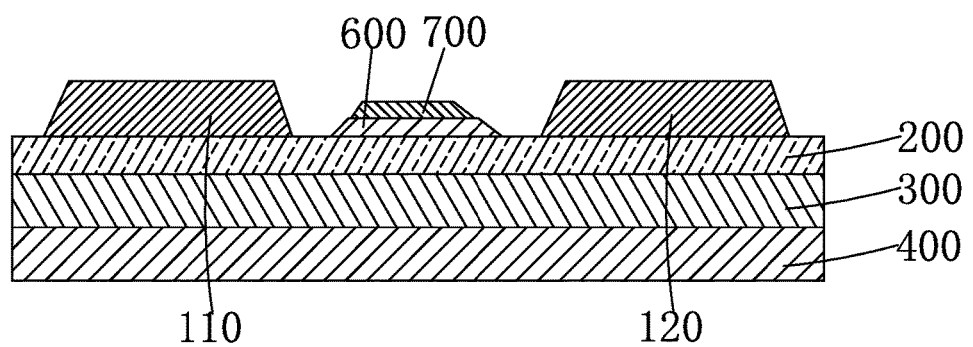
FIG. 8 is a schematic view illustrating Step S7 of the TFT substrate manufacturing method according to the present invention.

Step S7: as shown in FIG. 8, applying a photoresist peeling agent to remove the photoresist layer 500 and also to have portions of the organic insulation layer 600' and the gate electrode conductor layer 700' that are located on the photoresist layer 500 removed simultaneously with the photoresist layer 500 such that a gate insulation layer 600 is obtained with a remaining portion of the organic insulation layer 600' so as to be located on the graphene semiconductor active layer 200 and between the source electrode 110 and the drain electrode 120 and a gate electrode 700 is obtained with a remaining portion of the gate electrode conductor layer 700' so as to be located on the gate insulation layer 600.

Figure 9:
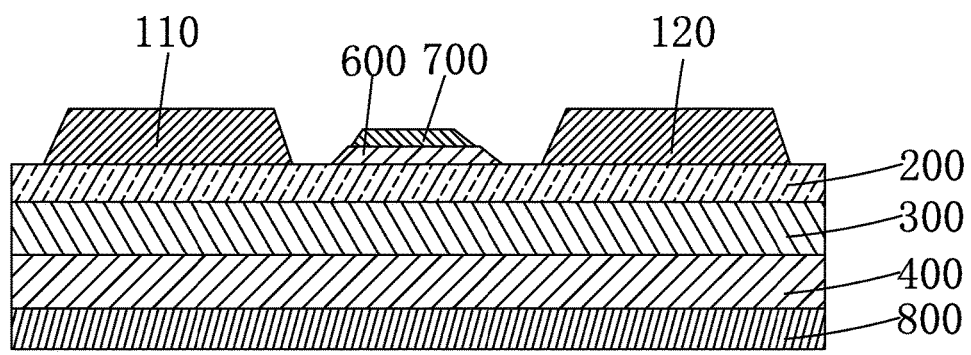
FIG. 9 is a schematic view illustrating Step S8 of the TFT substrate manufacturing method according to the present invention.

In a TFT substrate formed with the present invention, the organic base 400 functions as a base that is located on the outermost side to provide a support to a TFT device and is made of a material that is resistant to acid, alkali, and water and can be selected as PDMS or other materials that can be formed through solution coating process. Further, the TFT substrate manufacturing method according to the present invention may further comprises Step S8: as shown in FIG. 9, providing a reinforcement base 800 and melting the organic base 400 for attaching to the reinforcement base 800.

Specifically, the reinforcement base 800 can be made of glass, a plastic material of polyethylene terephthalate (PET), or a silicon plate.

In the above-described TFT substrate manufacturing method, an operation of tuning up-side down is involved to allow a metal foil 100' that is used to deposit a graphene film to be re-used as an electrode material for formation of source and drain electrodes 110, 120 so that an effect of lowering down manufacturing cost and simplifying operations can be achieved. And, through application of lift-off technique, only one mask is necessary to obtain patterned source electrode 110, drain electrode 120, and gate electrode 700.

In summary, the present invention provides a TFT substrate manufacturing method, which comprises first depositing a graphene film on a metal foil, followed by applying an operation of changing graphene bang gap to form a graphene semiconductor active layer, and then, sequentially forming an inorganic insulation layer and an organic base on the graphene semiconductor active layer, wherein through an operation turning up-side down, the metal foil is set on a topmost layer, followed by forming a photoresist layer, through a patterning operation, on the metal foil, subjecting the metal foil to etching with the photoresist layer serving as a shielding layer to form a source electrode and a drain electrode, and then, sequentially forming an organic insulation layer and a gate electrode conductor layer on the photoresist layer and the graphene semiconductor active layer, and finally, applying a photoresist peeling agent to remove the photoresist layer with portions of the organic insulation layer and the gate electrode conductor layer located on the photoresist layer being simultaneously therewith to thereby form patterned gate insulation layer and gate electrode. The manufacturing method involves an operation of turning up-side down to to allow the metal foil that is used to deposit a graphene film to be re-used as an electrode material for formation of the source and drain electrodes so that an effect of lowering down manufacturing cost and simplifying operations can be achieved. And, through application of lift-off technique, only one mask is necessary to obtain patterned source electrode, drain electrode, and gate electrode.

Based on the description given above, those having ordinary skills in the art may easily contemplate various changes and modifications of he technical solution and the technical

What is claimed is:

1. A thin-film transistor (TFT) substrate manufacturing method, comprising the following steps:
   Step S1: providing a metal foil, depositing a graphene film on the metal foil, and applying an operation of changing graphene band gap to obtain a graphene semiconductor active layer;
   Step S2: forming, through deposition, an inorganic insulation layer on the graphene semiconductor active layer;
   Step S3: forming an organic base on the inorganic insulation layer to form a primary structure;
   Step S4: turning up-side down the primary structure formed in Step S3 to set the organic base as a bottommost layer and the metal foil as a topmost layer, and forming a photoresist layer, through a patterning operation with a mask, on the metal foil;
   Step S5: subjecting the metal foil to etching by using the photoresist layer as a shielding layer so as to form a source electrode and a drain electrode that are spaced from each other;
   Step S6: forming an organic insulation layer on the photoresist layer and the graphene semiconductor active layer, and forming, through deposition, a gate electrode conductor layer on the organic insulation layer; and
   Step S7: applying a photoresist peeling agent to remove the photoresist layer and also to have portions of the organic insulation layer and the gate electrode conductor layer that are located on the photoresist layer removed simultaneously with the photoresist layer such that a gate insulation layer is obtained with a remaining portion of the organic insulation layer so as to be located on the graphene semiconductor active layer and between the source electrode and the drain electrode and a gate electrode is obtained with a remaining portion of the gate electrode conductor layer so as to be located on the gate insulation layer.

2. The TFT substrate manufacturing method as claimed in claim 1, wherein the metal foil is made of a material of copper or nickel.

3. The TFT substrate manufacturing method as claimed in claim 1, wherein in Step S1, the operation of changing graphene band gap involves chemical doping, wherein chemical doping is conducted on the graphene film at the same time of deposition thereof so that graphene so deposited is a doped graphene film so as to obtain the graphene semiconductor active layer; or, alternatively,
   the operation of changing graphene band gap involves photolithography, wherein, after the deposition of the graphene film, the graphene film is cut into thin ribbons to form graphene nanoribbon, so as to obtain the graphene semiconductor active layer.

4. The TFT substrate manufacturing method as claimed in claim 1, wherein in Step S1, plasma enhanced chemical vapor deposition is used to deposit the graphene film, and the graphene film so deposited is a single-layered graphene film; and the graphene semiconductor active layer has a bang gap that is greater than 0.1 eV.

5. The TFT substrate manufacturing method as claimed in claim 1, wherein in Step S2, chemical vapor deposition is used to deposit and form the inorganic insulation layer, and the inorganic insulation layer is made of a material comprising silicon nitride, silicon oxide, diyttrium trioxide, or hafnium dioxide.

6. The TFT substrate manufacturing method as claimed in claim 1, wherein in Step S3, the organic base is formed through solution coating and curing and the organic base is made of a material of polydimethylsiloxane.

7. The TFT substrate manufacturing method as claimed in claim 1, wherein in Step S5, a wet etching operation is applied to subject the metal foil to etching.

8. The TFT substrate manufacturing method as claimed in claim 1, wherein in Step S6, a coating operation is applied to form the organic insulation layer, and the organic insulation layer is made of a material of polymethylmethacrylate.

9. The TFT substrate manufacturing method as claimed in claim 1, wherein in Step S6, physical vapor deposition is applied deposit and form the gate electrode conductor layer, and the gate electrode conductor layer is made of a material comprising aluminum, copper, or indium tin oxide.

10. The TFT substrate manufacturing method as claimed in claim 1 further comprising Step S8 of providing a reinforcement base and melting the organic base for attaching to the reinforcement base;
    wherein the reinforcement base comprises glass, a plastic material of polyethylene terephthalate, or a silicon plate.

11. A thin-film transistor (TFT) substrate manufacturing method, comprising the following steps:
    Step S1: providing a metal foil, depositing a graphene film on the metal foil, and applying an operation of changing graphene band gap to obtain a graphene semiconductor active layer;
    Step S2: forming, through deposition, an inorganic insulation layer on the graphene semiconductor active layer;
    Step S3: forming an organic base on the inorganic insulation layer to form a primary structure;
    Step S4: turning up-side down the primary structure formed in Step S3 to set the organic base as a bottommost layer and the metal foil as a topmost layer, and forming a photoresist layer, through a patterning operation with a mask, on the metal foil;
    Step S5: subjecting the metal foil to etching by using the photoresist layer as a shielding layer so as to form a source electrode and a drain electrode that are spaced from each other;
    Step S6: forming an organic insulation layer on the photoresist layer and the graphene semiconductor active layer, and forming, through deposition, a gate electrode conductor layer on the organic insulation layer; and
    Step S7: applying a photoresist peeling agent to remove the photoresist layer and also to have portions of the organic insulation layer and the gate electrode conductor layer that are located on the photoresist layer removed simultaneously with the photoresist layer such that a gate insulation layer is obtained with a remaining portion of the organic insulation layer so as to be located on the graphene semiconductor active layer and between the source electrode and the drain electrode and a gate electrode is obtained with a remaining portion of the gate electrode conductor layer so as to be located on the gate insulation layer;
    wherein in Step S2, chemical vapor deposition is used to deposit and form the inorganic insulation layer, and the inorganic insulation layer is made of a material comprising silicon nitride, silicon oxide, diyttrium trioxide, or hafnium dioxide; and wherein in Step S3, the organic base is formed through solution coating and curing and the organic base is made of a material of polydimethylsiloxane.

12. The TFT substrate manufacturing method as claimed in claim 11, wherein the metal foil is made of a material of copper or nickel.

13. The TFT substrate manufacturing method as claimed in claim 11, wherein in Step S1, the operation of changing graphene band gap involves chemical doping, wherein chemical doping is conducted on the graphene film at the same time of deposition thereof so that graphene so deposited is a doped graphene film so as to obtain the graphene semiconductor active layer; or, alternatively, the operation of changing graphene band gap involves photolithography, wherein, after the deposition of the graphene film, the graphene film is cut into thin ribbons to form graphene nanoribbon, so as to obtain the graphene semiconductor active layer.

14. The TFT substrate manufacturing method as claimed in claim 11, wherein in Step S1, plasma enhanced chemical vapor deposition is used to deposit the graphene film, and the graphene film so deposited is a single-layered graphene film; and the graphene semiconductor active layer has a bang gap that is greater than 0.1 eV.

15. The TFT substrate manufacturing method as claimed in claim 11, wherein in Step S5, a wet etching operation is applied to subject the metal foil to etching.

16. The TFT substrate manufacturing method as claimed in claim 11, wherein in Step S6, a coating operation is applied to form the organic insulation layer, and the organic insulation layer is made of a material of polymethylmethacrylate.

17. The TFT substrate manufacturing method as claimed in claim 11, wherein in Step S6, physical vapor deposition is applied deposit and form the gate electrode conductor layer, and the gate electrode conductor layer is made of a material comprising aluminum, copper, or indium tin oxide.

18. The TFT substrate manufacturing method as claimed in claim 11 further comprising Step S8 of providing a reinforcement base and melting the organic base for attaching to the reinforcement base;

wherein the reinforcement base comprises glass, a plastic material of polyethylene terephthalate, or a silicon plate.

* * * * *